US006473356B1

United States Patent
Raszka

(10) Patent No.: US 6,473,356 B1
(45) Date of Patent: Oct. 29, 2002

(54) LOW POWER READ CIRCUITRY FOR A MEMORY CIRCUIT BASED ON CHARGE REDISTRIBUTION BETWEEN BITLINES AND SENSE AMPLIFIER

(75) Inventor: Jaroslav Raszka, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 10/002,568

(22) Filed: Nov. 1, 2001

(51) Int. Cl.[7] ................................................ G11C 8/00
(52) U.S. Cl. .................... 365/230.03; 365/203; 365/205
(58) Field of Search ........................... 365/230.03, 203, 365/205, 189.01, 154, 230.01

(56) References Cited

U.S. PATENT DOCUMENTS 6,301,173 B2 * 10/2001 Fujioka et al. ............... 365/203

* cited by examiner

Primary Examiner—David Nelms
Assistant Examiner—David Lam
(74) Attorney, Agent, or Firm—Danamraj & Youst, P.C.

(57) ABSTRACT

Circuitry and method for effectuating low power read operations in a memory circuit, e.g., a memory instance having a banked architecture. When a memory read cycle is initiated with respect to a particular memory cell in a selected bank based on a plurality of address signals, a specific wordline associated with the memory cell is driven high. Upon waiting until the bitline coupled thereto reach a predetermined sense level, the wordline is shut off based on a reference memory cell structure, which wordline thereby stops driving the bitline. Subsequently, after waiting for a select time, the sense amplifier senses the data stored in the particular memory cell based a charge distribution between its internal node(s) and the bitline after the selected wordline is deactivated.

30 Claims, 8 Drawing Sheets

LOW POWER READ CIRCUITRY FOR A MEMORY CIRCUIT BASED ON CHARGE REDISTRIBUTION BETWEEN BITLINES AND SENSE AMPLIFIER

BACKGROUND OF THE INVENTION

1. Technical Field of the Invention

The present invention relates generally to semiconductor memories. More particularly, and not by way of any limitation, the present invention is directed to high performance CMOS memory circuits having low power read circuitry based on charge redistribution between a selected bitline pair and the internal nodes of a sense amplifier ("sense amp") used for sensing data.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that performance parameters such as access time, overall memory cycle time, power consumption, et cetera, play a pivotal role in designing a memory circuit, whether provided in an embedded SOC application or as a stand-alone device. For high performance memories, accordingly, it is desirable that each of the following constituent components of the memory cycle time is minimized as much as possible in a read operation: clock-to-wordline selection; cell-to-sense amp; and sense amp-to-output. However, minimizing the overall read cycle time requires large devices in the sense amp and column multiplex (COLMUX) circuitry, which give rise to increased power consumption. Accordingly, there exist well known trade-off constraints in the field of high performance memory design.

Because the teachings of the present invention are particularly directed to addressing these design trade-offs in the context of sense amp operations, a brief description of sense amp functionality with respect to RAMs (e.g., Static Random Access Memory or SRAM) is immediately set forth hereinbelow.

RAMs comprising a plurality of memory cells are typically configured as an array of rows and columns, with one or more I/Os (i.e., ×4, ×8, ×16, etc. configurations). Also, such memories may be provided in a multi-bank architecture for applications where high speed and low power are required. Regardless of the architecture and type, each RAM cell is operable to store a single bit of information. Access to this information is facilitated by activating all memory cells in a given row (i.e., wordline or WL) and outputting the data onto bitlines associated with a selected column for providing the stored data value to the selected output. Once the data is disposed on the bitlines, voltage levels on the bitlines begin to separate to opposite power supply rails (e.g., $V_{DD}$ and $V_{SS}$ (or ground)), and a sense amp is utilized to amplify and latch the logic levels sensed on the bitlines after they are separated by a predetermined voltage difference, typically 10% or less of $V_{DD}$. Furthermore, the sense amp is usually provided as a differential sense amp, with each of the memory cells providing both a DATA signal and a DATA BAR signal on the complementary bitlines (i.e., data lines) associated with each column. In operation, prior to activating the memory cells, the bitlines are precharged and equalized to a common value. Once a particular row and column are selected, the memory cell associated therewith is activated such that it pulls one of the data lines toward ground, with the other data line remaining at the precharged level, typically $V_{DD}$. The sense amp coupled to the two complementary bitlines senses the difference between the two bitlines once it exceeds a predetermined value and the sensed difference is indicated to the sense amp as the differing logic states of "0" and "1".

There are two common types of sense amps utilized for memory devices: one being a current mirror differential sense amp and the other being a clocked-latch type differential sense amp. It is well known that clocked-latch type sense amps are generally more advantageous than current mirror sense amps for low supply voltage, low power and deep submicron processes because they dissipate less power and work better at low voltages. Further, circuitry for implementing a clocked-latch type sense amp utilizes less area.

Even where advanced clocked-latch type sense amps are employed for memory devices, trade-offs such as speed vs. power constraints continue to plague current memory design techniques. Primarily, this is so because in traditional designs wordline pulse timing (i.e., the time period during which the selected wordline is held high) is approximately the same as the timing of COLMUX and sense amp gating switch control. On the one hand, the COLMUX and sense amp devices need to be large to ensure that the sense amp's differential is close to bitline differential. On the other hand, it may also be necessary to reduce the device sizes so as to minimize additional load on the bitlines, to reduce substrate noise from associated diffusion, and to reduce the bitline asymmetry (which is more pronounced when larger devices are employed). In low power applications with multi-bank architectures, the trade-off becomes a critical issue since the number of physical rows in a memory bank tends to be small, wherein the bitline voltage levels move fairly rapidly.

SUMMARY OF THE INVENTION

Accordingly, the present invention advantageously provides circuitry and method for effectuating low power read operations in a memory circuit, e.g., a compilable instance having a banked architecture, wherein wordline timing is preferably decoupled from the column mux/sense amp timing so that better control of bitline differential is advantageously achieved. As a consequence, smaller geometries can be utilized for the column mux and sense amp blocks without sacrificing access time performance. Furthermore, the use of smaller devices provides better noise immunity characteristics because such devices enable the column mux/sense amp circuitry to operate as a first or second order low pass filter.

In one aspect, the present invention is directed to a low power read methodology operable with a memory circuit. When a memory read cycle is initiated with respect to a particular memory cell in a selected bank based on a plurality of address signals, a specific wordline associated with the memory cell is driven high. Upon waiting until the voltage level on the bitline coupled thereto reaches a predetermined sense level, the wordline is shut off based on a reference memory cell structure. Accordingly, the wordline stops driving the bitline after a short time period. Subsequently, after waiting for a select time, the sense amp associated with the bitline also reaches the sense level by way of charge redistribution between its internal node(s) and the bitline. The sense amp is then enabled to sense the data stored in the particular memory cell based the redistributed charge on the nodes. A bitline precharge operation takes place thereafter to equalize the bitline's voltage prior to the following memory cycle.

In another aspect, the present invention is directed to a memory circuit having low read power capability. Preferably, the memory circuit may be provided as a compilable instance. Wordline decoder and driver circuitry is included to initiate a memory read operation with respect to a particular memory cell based on a plurality of address signals and a START signal, which START signal is dependent upon a BANK SELECT signal operable to select a particular memory bank of the memory circuit. Essentially, the wordline decoder and driver circuitry operates to drive a selected wordline associated with the particular memory cell high responsive to the plurality of address signals and the START signal. A reference wordline driver is included in the memory circuit, which driver is operable responsive at least in part to the START signal to drive a reference wordline associated with at least one reference cell structure. A pair of complementary reference bitlines coupled to the reference cell structure are operable to generate a voltage signal after a finite time has elapsed from the START signal. Further, circuitry for generating a STOP signal is also included in the memory circuit, which STOP signal is generated when the voltage signal developed on the complementary reference bitlines reaches a particular level, for example, about half of $V_{DD}$ level. In accordance with the teachings of the present invention, the STOP signal operates to deactivate the selected wordline and activates thereafter a sense amp operably coupled to the particular memory cell via a pair of complementary bitlines. Consequently, the wordline pulse is active only as long as is necessary to develop sufficient differential in the bitlines, which differential is transferred from the bitlines to the sense amp due to charge redistribution. Accordingly, the sense amp is preferably operable to sense the data value stored in the particular memory cell based on a charge redistribution between the sense amplifier's internal nodes and the bitline pair after the selected wordline is deactivated.

In an exemplary embodiment of the present invention, the memory circuit preferably includes a "resistive" structure operable to mimic impedance and bitline resistance between the selected bitlines and sense amp. The resistive structure is operable to generate an analog sense amplifier control (ASAE) signal based on the STOP signal after a predetermined delay. Also, a capacitor structure is coupled to the resistive structure for simulating the sense amp's capacitance. Circuitry operating responsive to the ASAE signal is provided for generating a SENSE AMPLIFIER ENABLE BAR control signal (SAEB) when the ASAE signal reaches a particular level, e.g., about half of $V_{DD}$ level.

In yet another aspect, the present invention is directed to a low power read operation method for a memory circuit. First, a memory read cycle is initiated with respect to a particular cell in the memory circuit based on a plurality of address signals, wherein a selected wordline associated with the particular cell is driven high. A control signal is generated thereafter based on a reference cell read operation. Responsive to the control signal, the selected wordline is deactivated thereafter. Subsequently, a sense amp operably coupled to the particular memory cell via a pair of complementary bitlines is activated, wherein the sense amp operates to latch a data value stored in the particular cell based on a charge redistribution between the sense amp's internal nodes and the bitline pair after the selected wordline is deactivated.

In a still further aspect, the present invention is directed to a memory instance, e.g., a RAM instance, a Flash memory instance, etc., having low power read capability in a multi-bank architecture. A BANK SELECT (BST) signal is operable to select a particular memory bank of the instance, which BST signal operates as a clock for the selected bank. Circuitry is included in the memory bank for commencing a memory read cycle with respect to a particular cell in the selected bank based on a plurality of address signals and a START signal. Circuitry is also included for generating a STOP signal based on a reference cell read operation, after a selected wordline associated with is particular cell is driven high. Responsive to the STOP signal, circuitry is provided for deactivating the selected wordline after a finite amount of time. A circuit block is included for activating a sense amp operably coupled to the particular memory cell via a pair of complementary bitlines, wherein the sense amp operates to latch a data value stored in the particular cell based on a charge redistribution between the sense amp's internal nodes and the bitline pair after the selected wordline is deactivated.

In a further exemplary embodiment, the functionality of STOP and START signals may be unified into a single control signal whereby a rising edge therein (i.e., one logic transition) is operable as one signal and a falling edge therein (i.e., the other logic transition) is operable as the other signal. Also, as a still further variation, such a control signal may be derived from the address signals themselves, wherein the rising and falling edges can be created as will be set forth in the following description.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
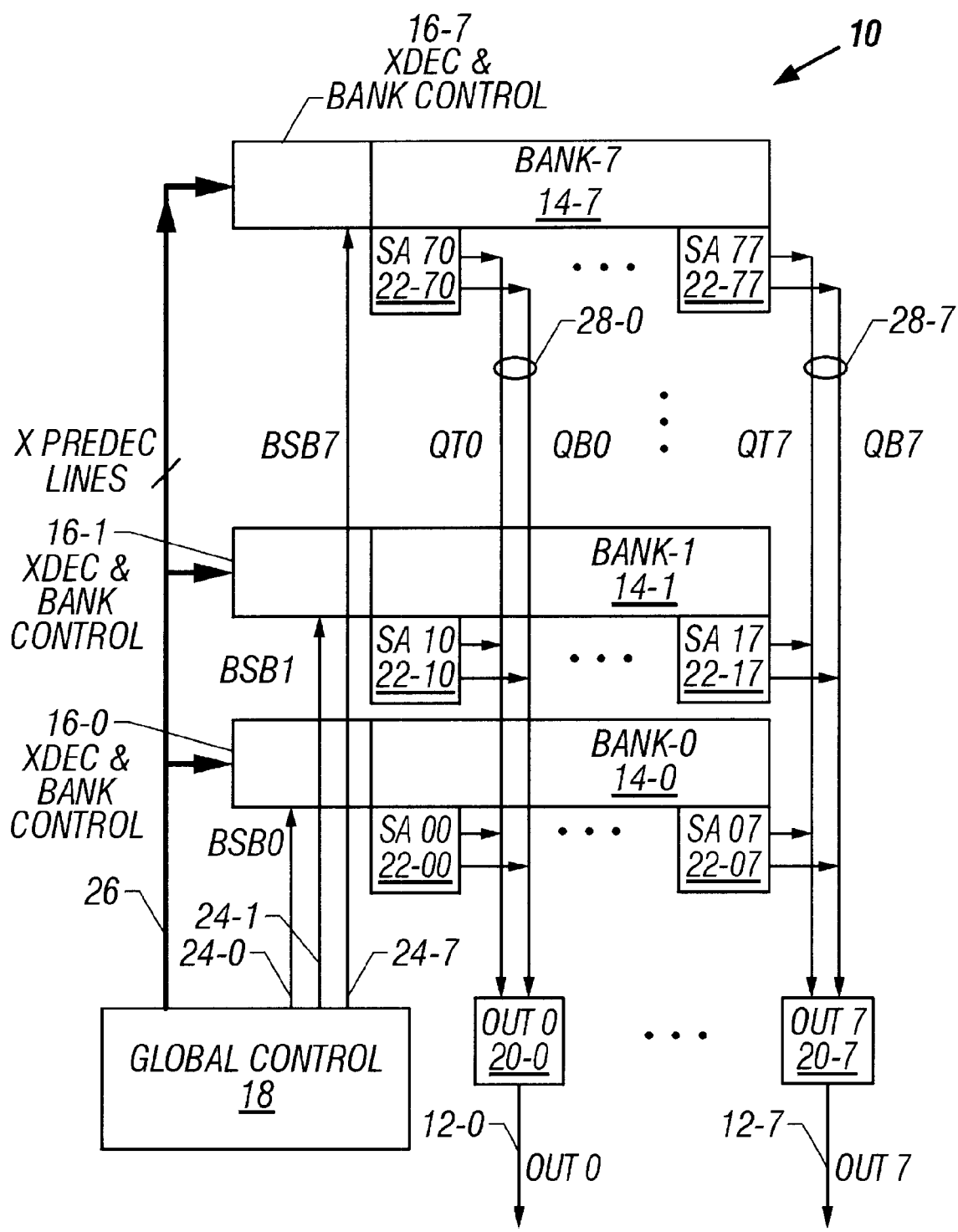
FIG. 1 depicts an exemplary embodiment of a multi-bank memory instance wherein the teachings of the present invention may be advantageously practiced.

In the drawings, like or similar elements are designated with identical reference numerals throughout the several views thereof, and the various elements depicted are not necessarily drawn to scale. Referring now to FIG. 1, depicted therein is an exemplary embodiment of a memory instance 10 with eight outputs (reference numerals 12-0 through 12-7) wherein the teachings of the present invention may be advantageously practiced. The memory instance 10 is comprised of a plurality of memory array banks each of which, in turn, comprises a plurality of memory cells arranged in rows and columns (not shown). For example, reference numerals 14-0 through 14-7 refer to eight memory array banks or bit cell arrays forming the memory instance 10. The memory cells are preferably of the random access type. In this exemplary embodiment, the memory cells collectively operate as a static random access memory (SRAM) instance. In a further exemplary implementation, the memory instance 10 may be provided as a compilable memory instance for SOC design.

Each memory array bank is provided with a row decoder/driver (XDEC) and bank control (BC) block, whereby a selected wordline is operable to activate all memory cells in a particular row of the array bank. XDEC/BC blocks 16-0 through 16-7 are exemplified for the array banks 14-0 through 14-7. Each XDEC/BC block is operable to receive a plurality of row predecoder signals 26 and a BANK SELECT BAR (BSB) signal provided by a global control block 18, which will be described in additional detail hereinbelow. Eight BSB signals, BSB 24-0 through BSB 24-7, are illustrative with respect to the eight memory banks 14-0 through 14-7.

Each column in a memory array bank has associated therewith a pair of complementary bitlines (not shown) which are connected to a sense amp disposed in a sense amp block operable with that memory array bank. In an exemplary memory architecture of the memory instance 10, a single sense amp may be provided for 4, 8 or 16 bitline pairs via a suitable column multiplex (COLMUX) circuitry. A plurality of sense amps are accordingly provided for each memory array bank of the memory instance 10. Each sense amp is operable to sense the output of a given column in a low power read operation, as will be described in greater detail hereinbelow.

In the exemplary embodiment depicted in FIG. 1, eight sense amps (SAs) are provided for each memory array bank. SA 22-00 through SA 22-07 are accordingly illustrated with respect to the memory array bank 14-0. In similar fashion, SA 22-10 through SA 22-17 and SA 22-70 through SA 22-77 are provided for the memory array banks 14-1 and 14-7, respectively. Each SA includes a pair of complementary internal data nodes (XT and XB, not shown in this FIG.) that are coupled to a global data line pair (referred to as $Q_T$ and $Q_B$) associated with a particular output of the memory instance 10. In the exemplary embodiment, eight output path circuit blocks (reference numerals 20-0 through 20-7) are illustrated. Thus, SA 22-00 through SA 22-70 (which are associated with output 12-0) are operably coupled to the global data line pair 28-0 which is in turn connected to the output path circuit 20-0. Similarly, SA 22-07 through SA 22-77 (which are associated with output 12-7 via output path circuit 20-7) are operably coupled to the global data line pair 28-7. It will be recognized that other conventional circuitry such as COLMUX, redundant array portions (if any), dummy wordlines or columns, et cetera, are not depicted in FIG. 1 for clarity. Additionally, although complementary $Q_T$ and $Q_B$ data lines are exemplified, the present invention is operable with single-ended global data lines also.

Figure 2:
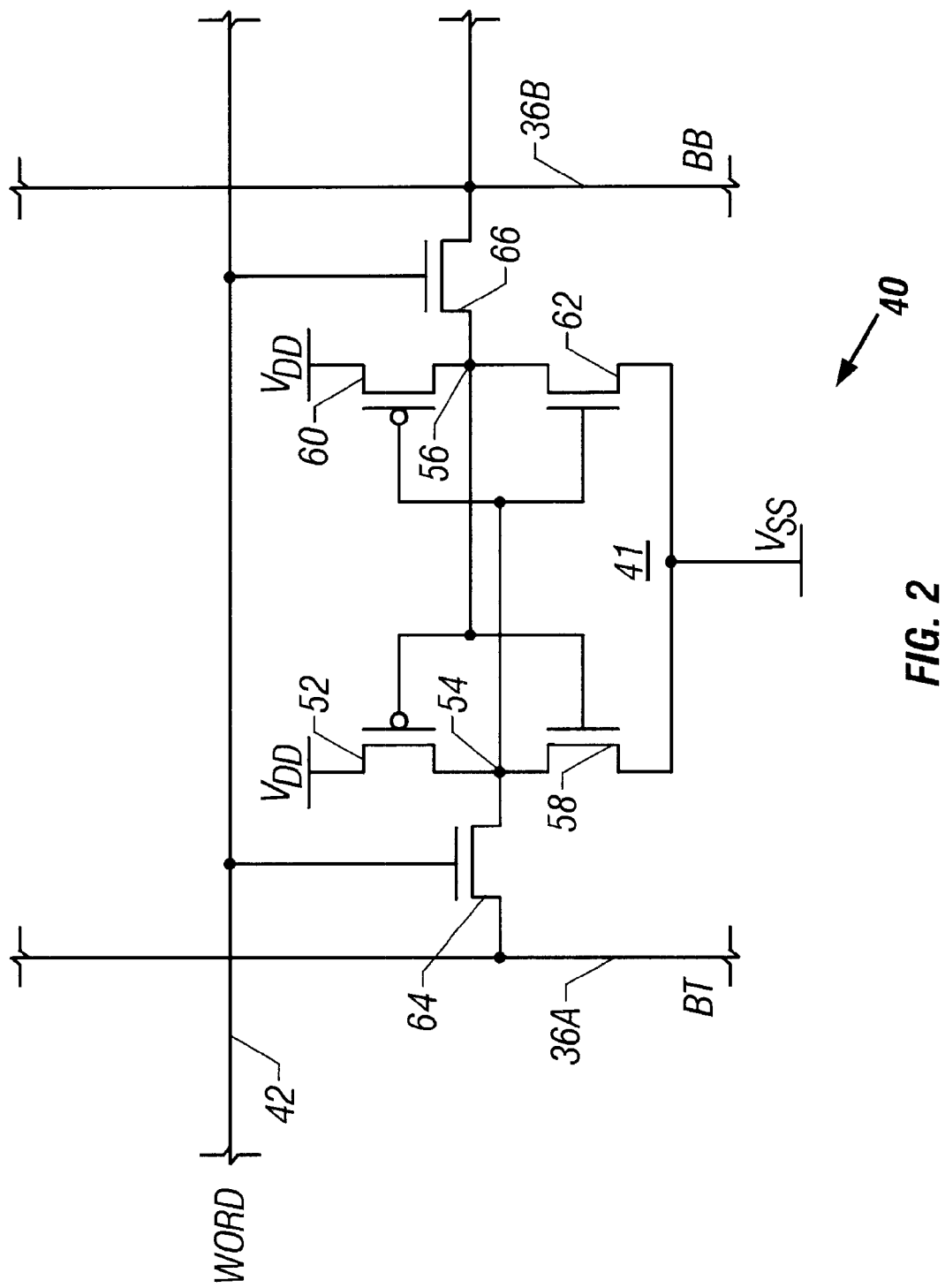
FIG. 2 illustrates a circuit diagram of an SRAM cell disposed in the memory instance of FIG. 1.

FIG. 2 depicts a circuit diagram of an exemplary SRAM cell 40 coupled to a pair of complementary bitlines, BIT TRUE (BT) and BIT BAR (BB) (reference numerals 36A and 36B, respectively), associated with a selected column. Each of the complementary bitlines is coupled to appropriate precharge circuitry (not shown in this FIG.) such that it is pulled to a power supply rail or a reference voltage source (typically $V_{DD}$ or any portion thereof) when the precharge circuitry is activated.

The exemplary memory cell 40 is comprised of a cross-coupled CMOS latch 41. A first PMOS transistor 52 has the source/drain thereof connected between $V_{DD}$ and a first data node 54, with the gate thereof connected to a second data node 56, the data nodes 54 and 56 comprising the two complementary storage nodes in the memory cell 40. An NMOS transistor 58 has the source/drain thereof connected between the data node 54 and a reference level, e.g., $V_{SS}$, with the gate thereof connected to the data node 56. A second PMOS transistor 60 has the source/drain thereof connected between $V_{DD}$ and the data node 56, with the gate thereof connected to the data node 54. A second NMOS transistor 62 has the source/drain thereof connected between the data node 56 and $V_{SS}$ reference, and the gate thereof also connected to the data node 54.

A first NMOS access transistor 64 is disposed between BT 36A and the data node 54, with the gate thereof coupled to a wordline 42 associated with the memory cell 40. In similar fashion, a second NMOS access transistor 66 has the source/drain thereof connected between BB 36B and the data node 56, wherein the gate of the NMOS 66 is driven by the wordline 42. The cross-coupled inverters of the memory cell form a latch, where nodes 54 and 56 will always hold complementary full swing data values.

Initially, the wordline 42 is held low and the precharge circuitry associated with the bitlines is activated so as to equalize the bitline voltage level to a predetermined high voltage. Since the bitlines 36A and 36B run the entire length of a column of memory cells disposed in the memory array bank, there is a significant amount of capacitance associated with these bitlines. During a read operation, the precharge circuitry (not shown) is turned off and the wordline 42 is activated so as to turn on the access transistors 64 and 66. Accordingly, the data node 54 is coupled to BT 36A and the data node 56 is coupled to BB 36B. If, for example, a logic "0" was stored on the data node 54 and a logic "1" was stored on the data node 56, transistor 58 would be turned on and transistor 62 would be turned off. Thus, transistor 58 would pull BT 36A low, discharging the capacitance on the bitline.

Those skilled in the art should readily appreciate that in order to maximize the speed of the memory (defined as how fast a transition from one logic level to the other can be effectuated in a normal memory access operation) sizes of the COLMUX and sense amp access devices need to be maximized as well, so that the differential voltage on SA's internal nodes rapidly tracks the bitline differential voltage. On the other hand, current design implementations also impose the requirement to keep the devices small in order to reduce the bitline load and substrate noise (from associated diffusion). Further, it is also desirable to minimize the bitline asymmetry as well as power consumption associated with switching the devices during the memory read operations. As pointed out in the Background section of the present patent application, the existing read circuitry designs do not adequately address these trade-offs.

Figure 3:
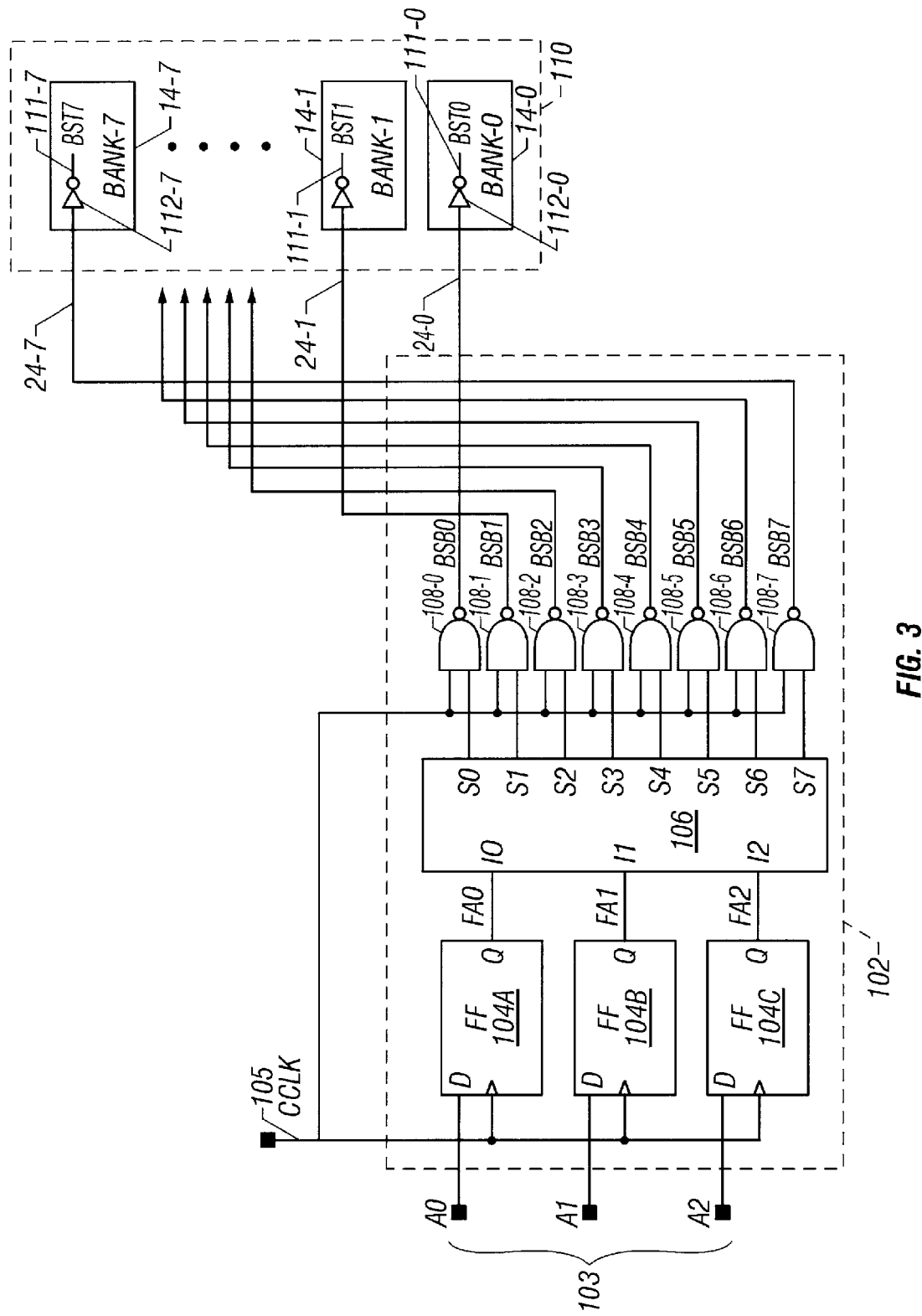
FIG. 3 depicts exemplary bank selection circuitry for selecting a particular memory bank.

Referring now to FIG. 3, depicted therein is an exemplary bank selection circuit 102 for selecting a particular memory bank of a memory instance, e.g., memory instance 10 described above. Reference numeral 110 refers to a composite array of eight memory banks that comprise the memory array of the instance 10 (shown in FIG. 1). The bank selection circuit 102, which may preferably be provided as part of the global control 18 of the memory instance 10, is operable responsive to an internal clock (CCLK) signal 105 that is generated from an appropriate "master" or "global" clock for the memory instance. As there are eight banks to be selected, three address signals, A0-A2 103, are provided for driving appropriate bank selection logic. Each of the address signals is provided to a corresponding D flip-flop (FF) that is clocked by the CCLK signal 105. Reference numerals 104A–104C refer to the three FFs in the exemplary embodiment depicted in FIG. 3.

Each FF is operable to store the address bit that it receives and then output the same at an appropriate time based on the CCLK signal. Subsequently, the address bits stored in the FFs are provided as an input to a 3-to-8 decoder 106. As illustrated, output FA0 from FF 104A is provided to I0, output FA1 is provided to I1, and output FA2 is provided to I2 of the decoder 106. Each of the eight outputs, S0-S7, generated by the decoder 106 is NANDed with the CCLK 105 by a corresponding NAND gate, which outputs a BANK SELECT BAR (BSB) signal when both CCLK and the corresponding decoder output are driven high.

Continuing to refer to FIG. 3, reference numerals 108-0 through 108-7 refer to the eight NAND gates utilized in the exemplary bank selection circuitry for selecting one of Bank-0 through Bank-7. As an example, when CCLK 105 is asserted and S0 is driven high, NAND 108-0 outputs a logic low on BSB0 24-0, which is provided to Bank-0 14-0 of the memory instance. Similarly, when CCLK 105 is asserted and S7 is driven high, NAND 108-7 outputs a logic low on BSB7 24-7, which is provided to Bank-7 14-7 of the memory instance. An inverter associated with or provided as part of each bank's bank control circuitry generates an active high BANK SELECT TRUE (BST) responsive to the BSB signal. For example, inverter 112-7 drives BST7 111-7 high when CCLK is asserted and S7 is driven high.

Figure 4:
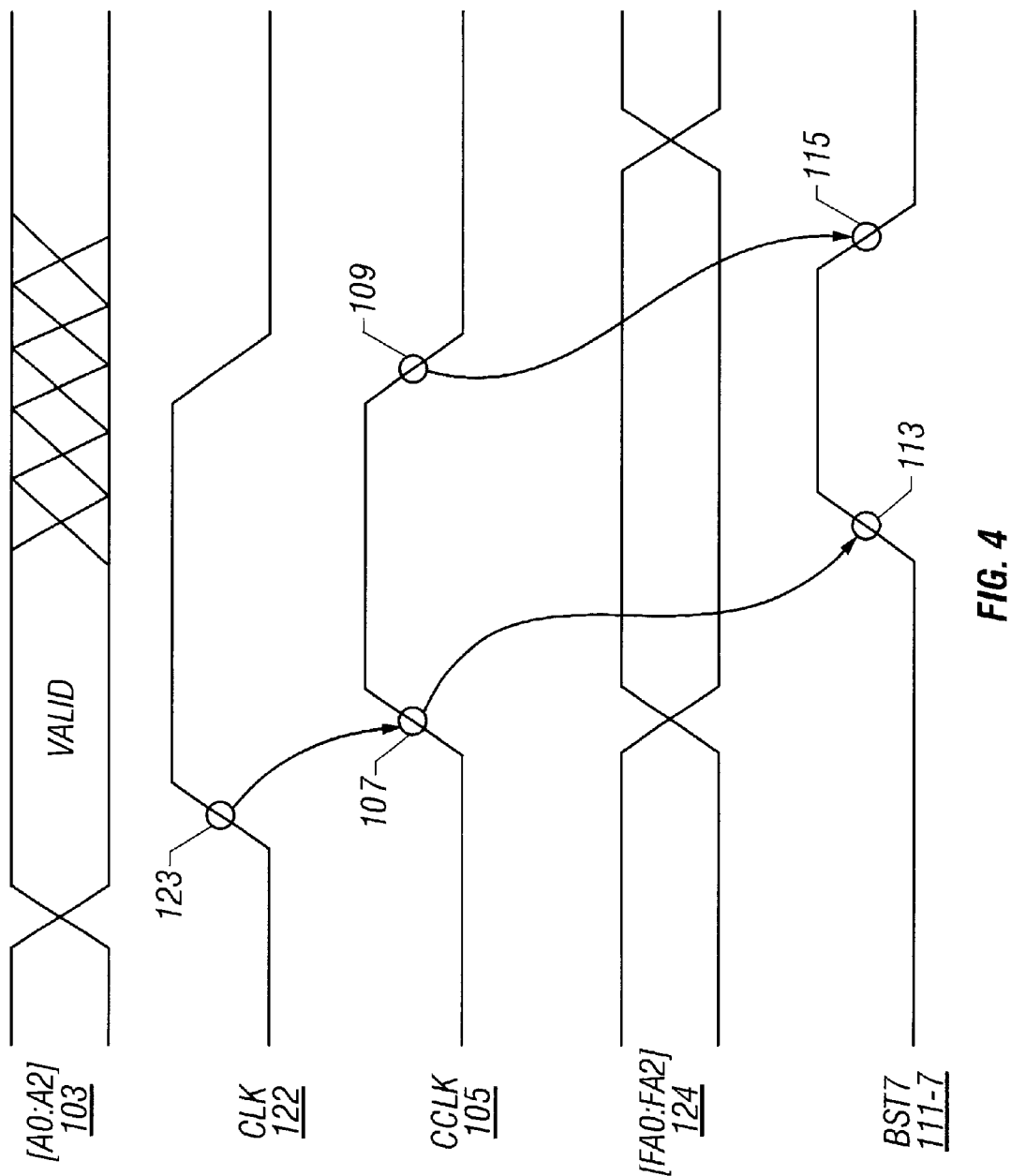
FIG. 4 is a simplified timing diagram which depicts timing relationships among the various signals with respect to the generation of an exemplary BANK SELECT signal for selecting a particular memory bank.

FIG. 4 is a simplified timing diagram which depicts timing relationships among the various signals with respect to the generation of an exemplary BANK SELECT signal for selecting a particular memory bank. Once the address signals 103 are valid, a master clock (CLK) signal 122 is driven high to form a rising edge 123 that provides a time base for the various signals. Responsive thereto, a rising edge 107 is formed in CCLK 105. The stored FA[2:0] signals 124 are created responsive to the address signals 103 and CCLK 105. Thereafter, a rising edge 113 is generated in a particular BST signal (e.g., BST7 111-7) by the bank selection logic circuitry as explained above. When a falling edge 109 is created by driving the internal clock CCLK 105 low, BST7 is also driven low, as illustrated by falling edge 115 therein, which deselects the eighth memory bank (Bank-7).

Figure 5:
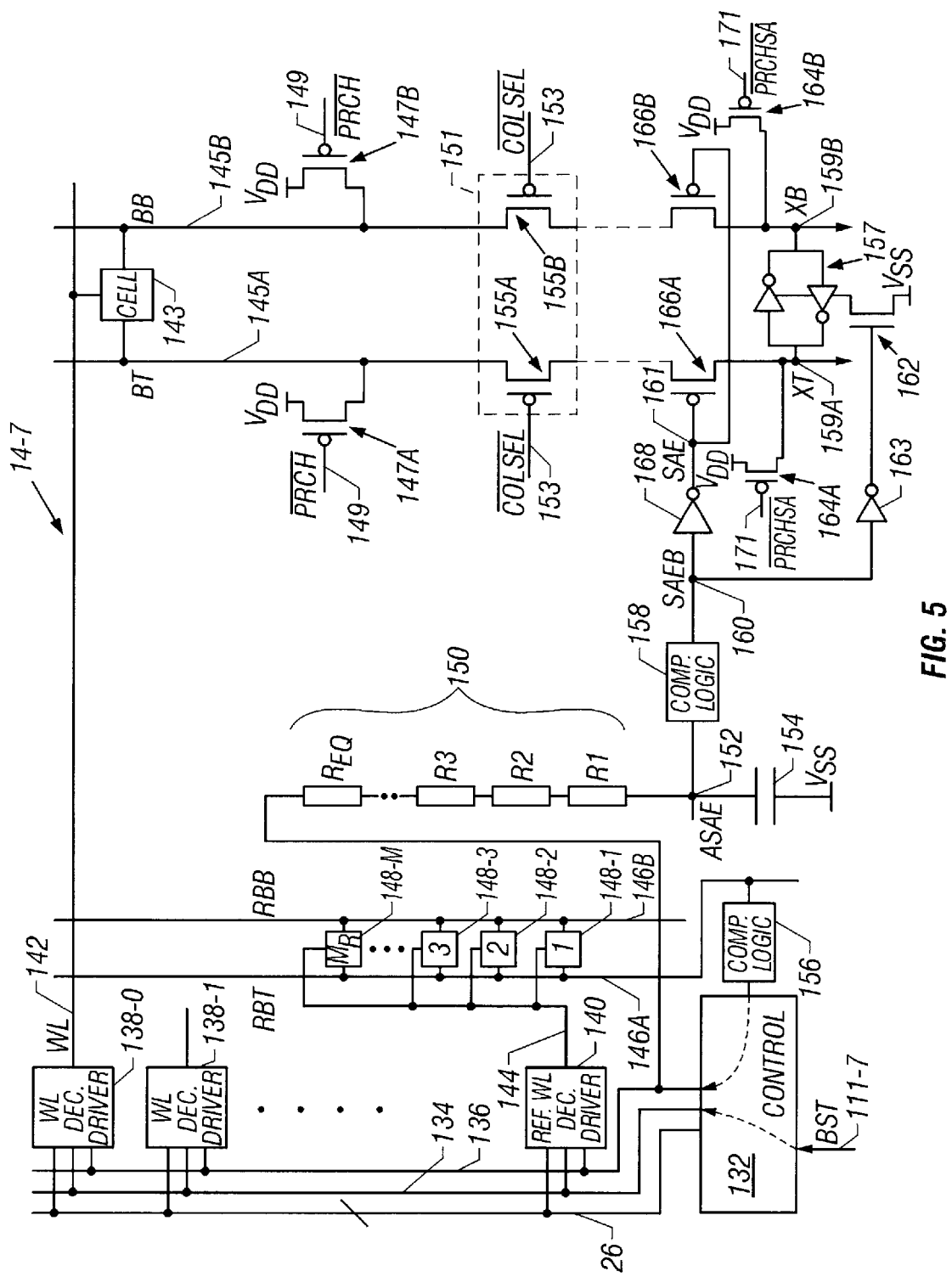
FIG. 5 is a circuit diagram of an exemplary memory bank wherein low power read circuitry is provided in accordance with one embodiment of the present invention.

Referring now to FIG. 5, depicted therein is a circuit diagram of an exemplary memory bank (e.g., bank 14-7) wherein low power read circuitry is provided in accordance with one embodiment of the present invention. A bank control block 132 is operable to receive BST 111-7, which signal operates as a bank clock for coordinating the various memory operations relative to the memory bank 14-7. Address signals are provided via row predecoder lines 26 to a plurality of row decoder/driver blocks 138-0 through 138-N, each of which is operable to activate a wordline (WL). For instance, WL 142 is controlled by WL decoder/driver block 138-0 and is operably coupled to a row of memory cells disposed in the bank 14-7. Reference numeral 143 refers to an exemplary memory cell disposed on the row of cells operable with WL 142. A pair of complementary bitlines BT 145A and BB 145B are coupled to the exemplary memory cell's data nodes, respectively.

As alluded to hereinabove, the bitlines 145A, 145B are precharged to $V_{DD}$ by PMOS devices 147A and 147B, which devices are operable responsive to a precharge control signal (PRCH BAR) 149. A column select block 151 is exemplified with a PMOS device disposed on each bitline, wherein the column select block is operable to couple the bitlines to a sense amp block by means of an active low control signal (COLSEL BAR) 153 pursuant to a memory access operation. Reference numerals 155A and 155B refer to the PMOS devices forming the exemplary column select block 151, each of which is gated by COLSEL BAR 153 which activates the devices when driven low. It should be appreciated by those skilled in the art that the simplified column select block 151 depicted in FIG. 5 is provided for illustrative purposes only and may be implemented in any known or heretofore unknown fashion within the context of the present invention.

Continuing to refer to FIG. 5, a pair of PMOS devices 166A and 166B operable as pass gates are disposed between the column select block 151 and sense amp 157, which is provided in one exemplary embodiment as a cross-coupled inverter that is connected to a sense amp enable device 162. As is well known in the art, the cross-coupled inverter structure of the sense amp 157 provides a pair of internal nodes XT 159A and XB 159B which are initially equalized to $V_{DD}$ by means of PMOS pull-up devices 164A, 164B that are driven by an active low sense amp precharge signal (PRCHSA BAR) 171. As will be explained below, when the pass gate devices 166A, 166B are activated under suitable signal conditions, the internal nodes XT 159A and XB 159B of the sense amp are put in an electrically conductive relationship with the selected bitlines and thus track the differential voltage level developed thereon pursuant to a memory access operation.

In accordance with the teachings of the present invention, each WL decoder/driver block is also provided with a START signal 134, which signal is based on BST 111-7, and a STOP signal 136 which operates to deactivate a selected WL. Further, the STOP signal 136 is generated based on a reference cell structure having at least one reference cell that is coupled to a reference wordline (RWL) 144. In the exemplary embodiment shown, reference numerals 148-1 through 148-M refer to a plurality of reference cells that are disposed between a pair of complementary reference bitlines RBT 146A and RBB 146B. A separate reference WL decoder/driver block 140 operable to drive RWL 144 is provided for controlling the operation of the reference cell structure operation. Preferably, the load driven by RWL 144 is operable to effectively track the WL load (i.e., all cells in the selected row), and it may be somewhat bigger than the WL load in an exemplary implementation.

A comparator logic block 156 coupled to one of the complementary reference bitlines (i.e., RBT 146A) is operable to generate a voltage after a finite time has elapsed from the START signal when RWL 144 is activated substantially at the same time as the activation of a selected WL in the bank. It should be appreciated that where multiple reference cells operable by means of a single RWL are utilized, the voltage level on RBT 146A can be developed very quickly. The comparator logic 156 coupled to RBT 146A is operable to generate an output which is provided to the bank control block 132. In one presently preferred exemplary embodiment of the present invention, the comparator logic 156 generates an output when the voltage level on RBT 146A reaches approximately about half of $V_{DD}$. The bank control block 132 is operable to generate the STOP signal 136 based on the analog comparator's output, which STOP signal is then utilized for deactivating the selected WL as well as the RWL.

Still continuing to refer to FIG. 5, the STOP signal 136 is also provided to a resistive structure 150 having one or more resistors in series that mimics the bitline resistance and impedance between the selected bitline and the sense amp 157. Accordingly, the output of resistive structure 150 is operable to track the STOP signal after a predetermined delay, which output provides a control signal (referred to hereinafter as analog sense amplifier enable control signal or ASAE) at a node 152. A capacitor structure 154 operable to mimic the capacitance of the sense amp 157 is disposed between the node 152 and the reference potential $V_{SS}$.

Another comparator logic block 158 is coupled to the node 152 and is driven by the ASAE signal accordingly. Preferably, the comparator logic 158 is operable to generate an output when the ASAE level reaches approximately about half of $V_{DD}$. The output of the analog comparator 158 provides as an active low SENSE AMP ENABLE BAR (SAEB) control signal 160 that is operable to activate the sense amp 157 by driving an inverter 163 which, in turn, drives the NMOS device 162 (i.e., firing the sense amp). Also, another inverter 168 driven by the SAEB signal 160 generates an SAE signal 161, which is driven high when the SAEB 160 is asserted low. Accordingly, the PMOS devices 166A and 166B are turned off and the sense amp is disconnected from the bitlines 145A, 145B.

With respect to implementation, the comparator logic blocks of the circuitry described hereinabove may be comprised of an inverting analog comparator, a simple inverter, and the like. Further, although separate STOP and START signals have been exemplified in particular detail, it should be understood that a single control signal may be provided whereby a rising edge therein (i.e., one logic transition) is operable as one signal and a falling edge therein (i.e., the other logic transition) is operable as the other signal. Also, as a further variation, such a control signal may be derived from the address signals themselves, wherein the rising and falling edges can be created as set forth in the foregoing description. In addition, although the embodiment depicted in FIG. 5 exemplifies a memory circuit having the complementary bitlines, those skilled in the art should readily recognize that the teachings of the present invention are also equally applicable with respect to memories having single bitlines (i.e., operable single-ended sense amp structures), with appropriate modifications to the reference cell structures.

Figure 6:
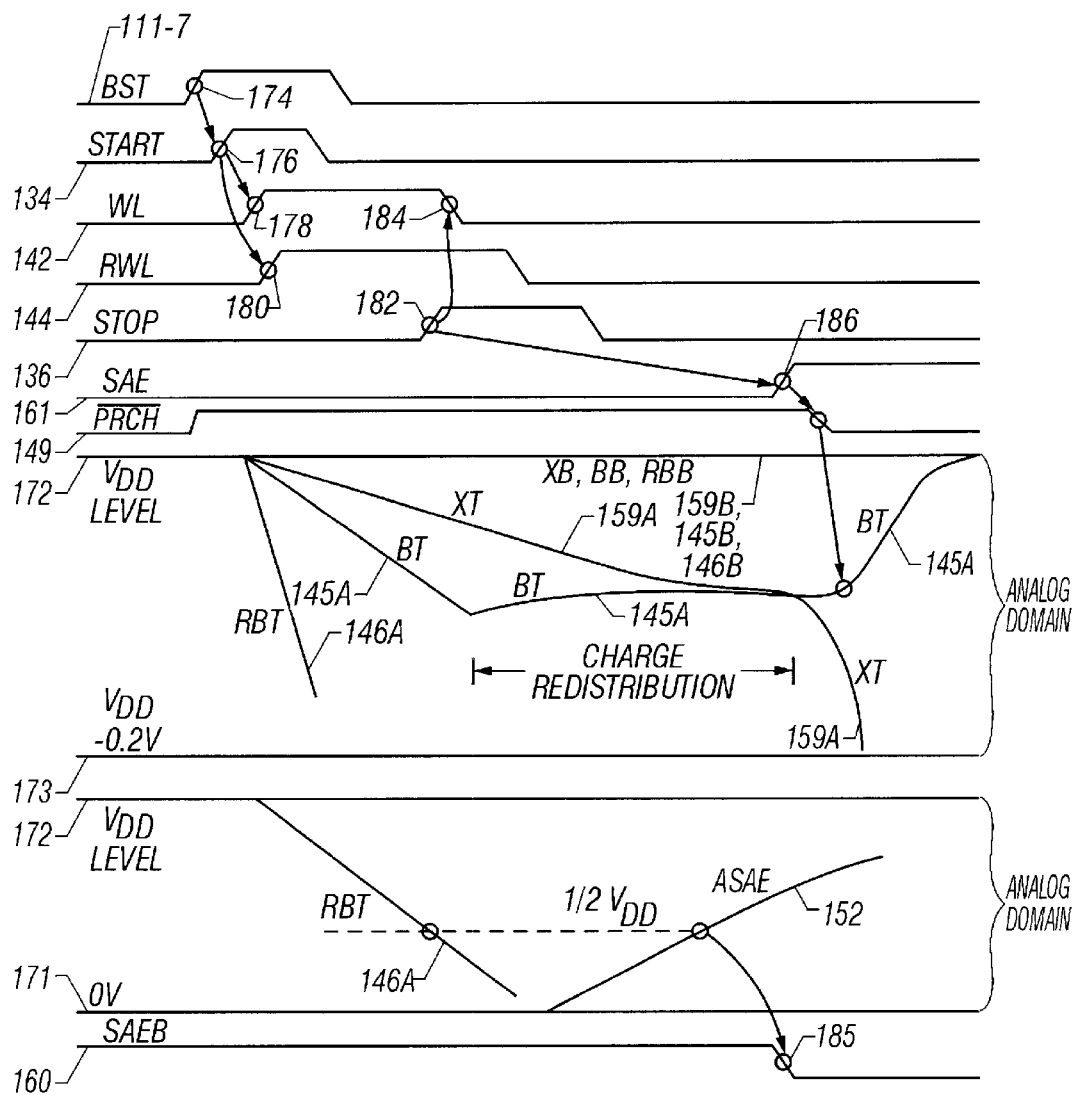
FIG. 6 is a composite diagram which depicts timing relationships among the various signals used in the practice of the present invention, as well as voltage levels in analog domain for illustrating the charge redistribution process between the bitlines and the internal nodes of the sense amp operating to sense data in accordance with the teachings of the present invention.

FIG. 6 is a composite diagram which depicts timing relationships among the various signals used in the practice of the present invention, as well as the applicable voltage levels in analog domain for illustrating the charge redistribution process between the bitline pair BT/BB and the internal nodes XT/XB of the sense amp 157 operating to sense data in accordance with the teachings of the present invention. For the sake of convenience, the composite diagram of FIG. 6 will be described by taking reference to the circuit diagram of FIG. 5 as needed. Upon asserting the bank clock signal, e.g., BST 111-7, by driving it high (as exemplified by the rising edge 174) pursuant to commencing a memory read cycle with respect to a particular memory cell, a rising edge 176 is created in the START signal 134 based thereon. Depending on the address input, a wordline associated with the memory cell is selected by driving WL high, as exemplified by the rising edge 178 in the exemplary WL 142. Further, the reference wordline (RWL) 144 is also driven high, responsive at least in part to the START signal 134. Reference numeral 180 refers to the rising edge of RWL 144, accordingly.

Although not specifically shown in the timing diagram of FIG. 6, it should be appreciated that appropriate logic levels for COLSEL BAR signal are provided (shown in FIG. 5) such that COLSEL BAR is driven low to select the appropriate complementary bitlines for the read operation. Initially, the BT/BB bitline pair of the memory cell and sense amp's internal nodes XT/XB are precharged. Accordingly, with respect to the BT/BB nodes, the bitline precharge signal (PRCH BAR) 149 is held low, thereby equalizing the voltage level on the bitlines. Pursuant to commencing the read cycle, the PRCH BAR as well as PRCHSA BAR signals are driven high to deactivate the charge equalization process.

Further, the SAEB 160 is held high and SAE 161 is held low initially, so that the sense amp's internal nodes are electrically coupled to the bitlines. As the read operation proceeds, a voltage differential develops on the bitlines based on the data values of memory cell nodes (in the exemplary operation, the data node coupled to BT holds a logic 0). Accordingly, the BT line 145A is pulled low, while the BB line 145B stays high. The sense amp's internal nodes XT and XB initially track the BT/BB voltage differential, as they are electrically coupled. Thus, XT 159A falls at a slower rate than BT 145A, while XB 159B remains at $V_{DD}$. Similarly, the RBT line 146A is also pulled low, but at a much quicker rate, pursuant to the reference cell access operation, while the RBB line 146B remains high. These voltage level changes are diagrammatically exemplified in the analog domains shown in FIG. 6, wherein exemplary $V_{DD}$ level 172 and a voltage level of about $V_{DD}$–0.2V (reference numeral 173) define one analog domain portion, and exemplary ground level 171 and exemplary $V_{DD}$ level 172 define another analog domain portion.

As the voltage level on the RBT 146A reaches about half of $V_{DD}$, the comparator logic 156 (shown in FIG. 5) is operational to generate an output, which is used by the bank control circuit 132 to generate the STOP signal 136. A rising edge 182 therein signifies that the logic level is driven high responsive to the RBT level. Thereafter, the selected wordline, i.e., WL 142, is deactivated by driving it low (as exemplified by the falling edge 184). The reference cell read operation is also deactivated by driving RWL 144 low. In addition, responsive to the appropriate RBT level, ASAE signal 152 is developed, which drives the other comparator block 158. As the WL is no longer driven, the data nodes of the memory cell are decoupled from the bitlines BT and BB, because the access transistors are shut off at this juncture. The voltage level on BT 145A thus proceeds to equalize (as exemplified by the slightly positive slope of the BT trace in the analog domain), while the voltage level on the node XT continues to develop due to charge redistribution between the bitlines and the sense amp's internal nodes. In the meantime, the voltage level of the ASAE signal 152 continues to approach a predetermined level (e.g., about half of $V_{DD}$), at which point the SAEB signal 160 is asserted by driving it low. Reference numeral 185 refers to the falling edge created in SAEB 160 accordingly, which is used for firing the sense amp by activating the pull-down device 162. Responsive to the SAEB going low, SAE 161 is driven high, as exemplified by the rising edge 186 therein. As a result, the sense amp is decoupled from the bitlines. The differential between the XT and XB nodes of the sense amp, however, is already at a level due to charge redistribution that supports accurate latching of the data. On the other hand, read power consumption has been minimized because the WL has been allowed to be driven high only for a short period and then turned off. After the sense amp operation is completed, the PRCH BAR signal 149 is driven low to commence the precharging of the bitlines. Accordingly, the BT trace assumes a steep positive slope towards $V_{DD}$.

Figure 7A:
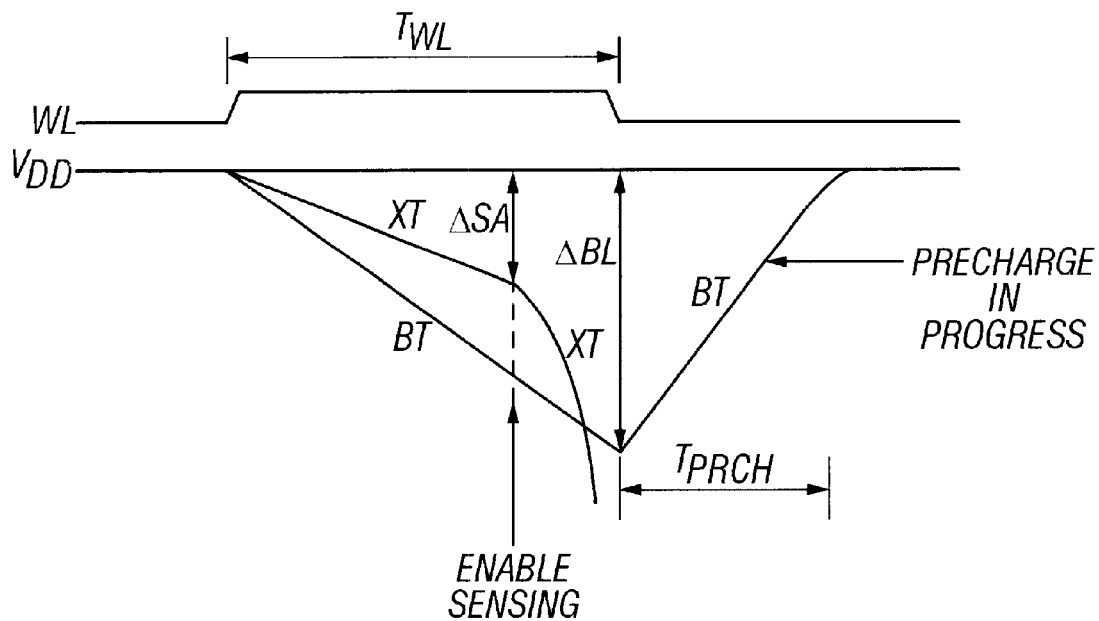
FIG. 7A (Prior Art) depicts a conventional memory read methodology, which is provided for contrasting with the inventive low power memory read methodology shown in FIG. 7B.
Figure 7B:
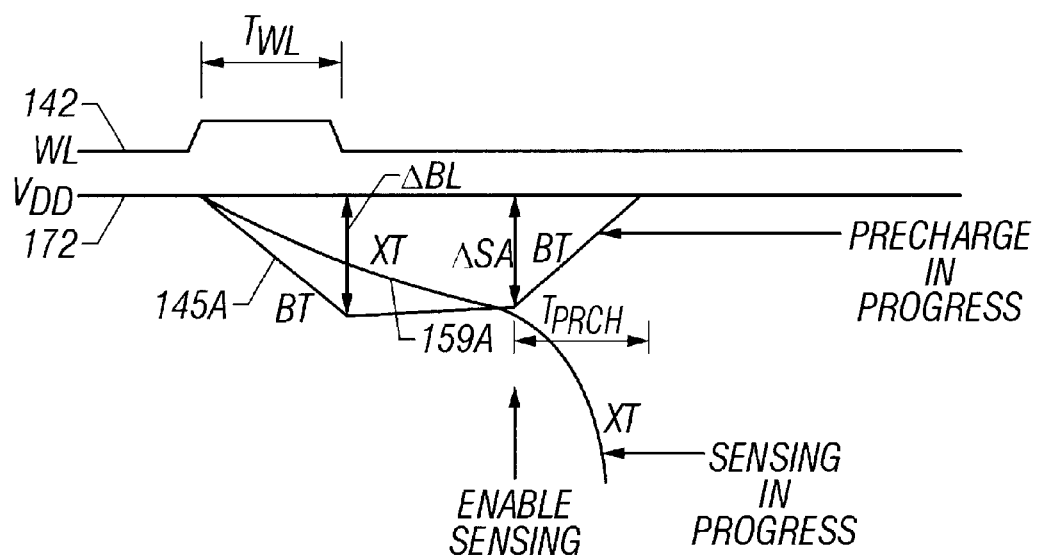
FIG. 7B depicts the analog domain portion of FIG. 6 to highlight the shortened wordline read pulse in accordance with the teachings of the present invention.

Referring now to FIG. 7A (Prior Art) and FIG. 7B, shown therein respectively are a conventional memory read methodology and the inventive low power memory scheme, for highlighting the shortened wordline read pulse in accordance with the teachings of the present invention. In the conventional methodology, upon enabling the selected wordline, the read process waits till the sense amp reaches the sensing level, i.e., $\Delta_{BL}$, for commencing actual sensing. Thus, the read pulse ($T_{WL}$) is much wider than is possible with the present invention as exemplified in FIG. 7B. In the present invention, the bitlines are driven only for a short period and, accordingly, the $T_{PRCH}$ value for bitline precharging is lower. As a cumulative result, power associated with the read operation ($\approx \Delta_{BL} \cdot \Sigma C_{BL} + \Delta_{SA} \cdot C_{SA}$) is advantageously lowered thereby.

In accordance with the foregoing, the low power read methodology of the present invention may be summarized as follows. A selected wordline is enabled based on a plurality of address signals. After a select time necessary for the bitlines to reach a voltage level that is operable for sensing ($\Delta_{SA}$) or thereabouts, the wordline is shut off so as to stop driving the bitlines. Upon waiting till the sense amp reaches the sense level by charge distribution, actual sensing is commenced by an ENABLE control signal as described in greater detail hereinabove. Shortly thereafter, bitline precharging is initiated to keep $T_{PRCH}$ to a minimum.

Figure 8:
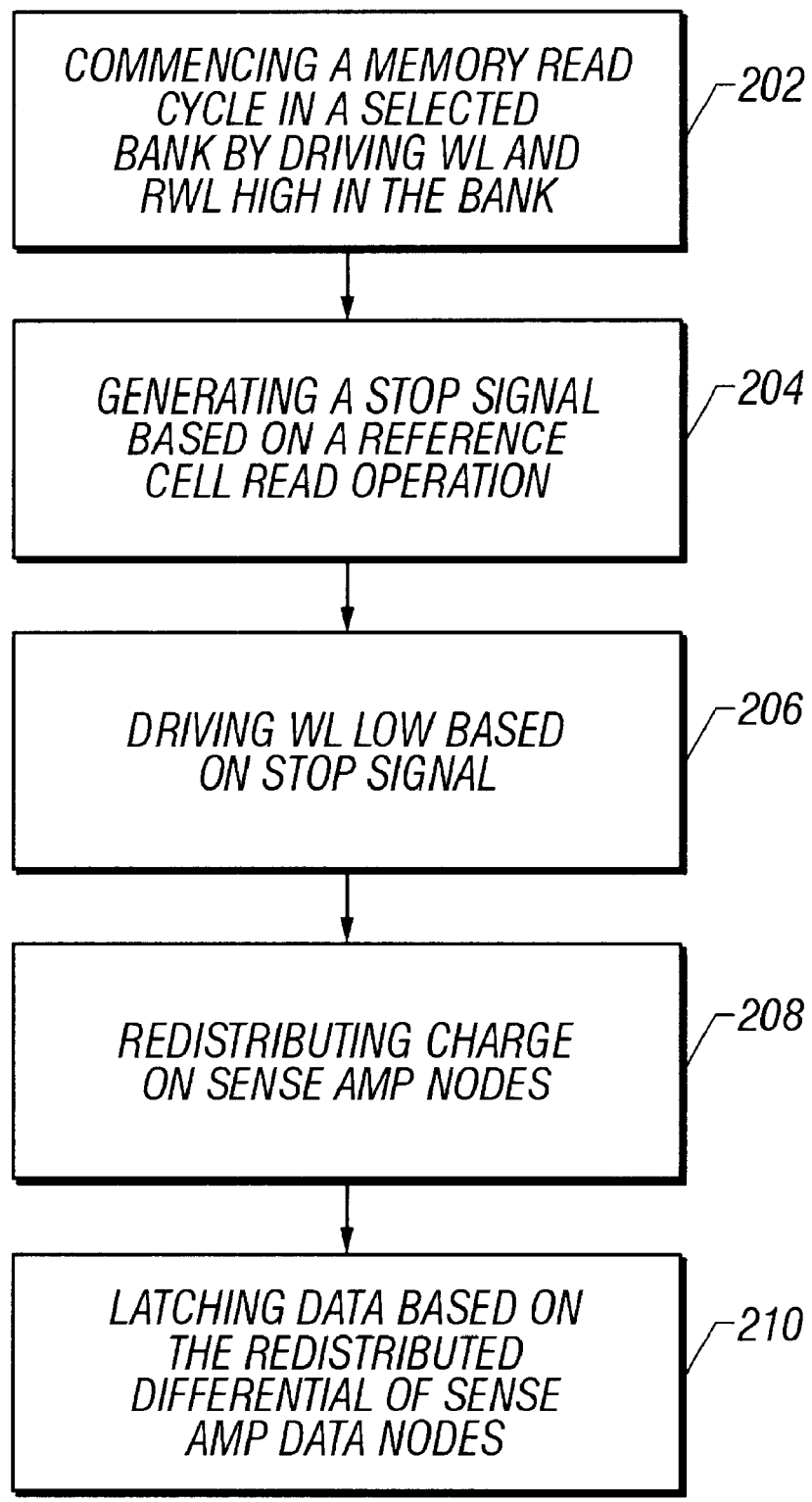
FIG. 8 is a flow chart of the various steps involved in an exemplary low power read operation method of the present invention for an illustrative banked memory circuit implementation.

Referring now to FIG. 8, shown therein is a flow chart of the various steps involved in an exemplary low power read operation method of the present invention for an illustrative banked memory circuit implementation. Upon commencing a memory read cycle in a selected bank by driving WL and RWL high (step 202), a STOP signal is generated based on a voltage level developed on a reference bitline pursuant to the reference cell read operation (step 204). Thereafter, the selected WL is driven low based on the STOP signal (step 206). Charge is redistributed between the selected bitlines and the sense amp's internal nodes after the selected WL is deactivated (step 208). The sense amp is fired at an appropriate time designed to ensure that the differential voltage on the sense amp's nodes is at a sufficient level for latching data (step 210).

Based on the foregoing, it should be appreciated that the present invention advantageously provides a low power read circuit and method that balances the various design trade-offs between access speed and device sizes in column MUX/sense amp circuitry. By decoupling wordline timing from the sense amp timing, better control of bitline differential is achieved. Further, as the devices sizes can be minimized without sacrificing the speed, process- and temperature-dependence of memory access performance is reduced. Moreover, the small devices in COLMUX and sense amp circuitry provide better noise immunity. Accordingly, a more robust memory design is advantageously obtained.

It is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although SRAM type compilable memory has been particularly exemplified herein, the teachings of the present invention may be practiced in other memory types and architectures (e.g., EPROMs, Flash memories, etc.), either in compilable form or as stand-alone devices, where sense amp circuitry is utilized for data access operations. Additional types of memories including, e.g., register files, content addressable memories (CAMs), and the like, can also advantageously implement the low power read circuitry of the present invention. Further, the specific components and gates comprising the sense amp circuitry, COLSEL BAR and precharge circuitry, etc. should be deemed to be only illustrative rather than limiting, as one of skilled in the art should readily recognize that identical or substantially similar logic functionality may be obtained by different device/gate implementations. Accordingly, all such modifications, substitutions, extensions, additions, combinations, et cetera, should be considered to be within the ambit of the present invention whose scope is limited solely by the claims appended hereinbelow.

What is claimed is:

1. A low power read operation method for a memory circuit, comprising the steps:

enabling a wordline pursuant to commencing a memory read cycle with respect to a particular cell in said memory circuit based on a plurality of address signals;

waiting for a first selected period of time until a voltage level on a bitline of a pair of complementary bitlines associated with said particular cell substantially reaches a predetermined sense level responsive to said wordline being driven high;

disabling said wordline so as to stop driving said pair of complementary bitlines;

waiting for a second selected period of time until a sense amplifier operable with said pair of complementary bitlines substantially reaches said predetermined sense level by a charge redistribution between said sense amplifier and said bitline;

enabling said sense amplifier for sensing a data value based on said predetermined sense level developed thereon; and commencing a precharging operation to precharge said bitline substantially at the same time when said sense amplifier is enabled.

2. The low power read operation method for a memory circuit as set forth in claim 1, wherein said step of disabling said wordline is accomplished in response to a voltage level developed on a reference bitline coupled to a reference memory cell structure driven by a reference wordline.

3. The low power read operation method for a memory circuit as set forth in claim 1, wherein said step of enabling said sense amplifier for sensing a data value is accomplished in response to a control signal generated due to a voltage level developed on a reference bitline coupled to a reference memory cell structure driven by a reference wordline.

4. A memory circuit having low power read capability, comprising:

means for enabling a wordline pursuant to commencing a memory read cycle with respect to a particular cell in said memory circuit based on a plurality of address signals;

means for waiting for a first selected period of time until a voltage level on a bitline associated with said particular cell substantially reaches a predetermined sense level responsive to said wordline being driven high;

means for disabling said wordline so as to stop driving said bitline;

means for waiting for a second selected period of time until a sense amplifier operable with said bitline substantially reaches said predetermined sense level by a charge redistribution between said sense amplifier and said bitline;

means for enabling said sense amplifier for sensing a data value based on said predetermined sense level developed thereon; and precharge circuitry to precharge said bitline substantially at the same time when said sense amplifier is enabled.

5. The memory circuit having low power read capability as set forth in claim 4, wherein said means of disabling said wordline includes a reference memory cell structure driven by a reference wordline substantially at the same time when said wordline is enabled.

6. The memory circuit having low power read capability as set forth in claim 4, wherein said particular memory cell comprises one of a static random access memory (SRAM) cell, a content addressable memory (CAM) cell and a register file structure.

7. The memory circuit having low power read capability as set forth in claim 4, wherein said particular memory cell comprises an electrically programmable read-only memory (EPROM) cell.

8. The memory circuit having low power read capability as set forth in claim 4, wherein said particular memory cell comprises a Flash memory cell.

9. A memory circuit, comprising:

means to initiate a memory read operation with respect to a particular memory cell based on a plurality of address signals and a START signal, said plurality of address signals and said START signal operating to drive a selected wordline associated with said particular memory cell high;

a reference wordline driver operating responsive at least in part to said START signal to drive a reference wordline associated with at least one reference cell structure, wherein a pair of complementary reference bitlines coupled to said at least one reference cell are operable to generate a voltage signal after a finite time has elapsed from said START signal; and means to generate a STOP signal when said voltage signal developed on said one of said pair of complementary reference bitlines reaches a particular level, wherein said STOP signal operates to deactivate said selected wordline and activates thereafter a sense amplifier operably coupled to said particular memory cell via a pair of complementary bitlines, said sense amplifier operating to sense a data value stored in said particular memory cell based on a charge redistribution between said sense amplifier's internal nodes and said pair of complementary bitlines after said selected wordline is deactivated.

10. The memory circuit as set forth in claim 9, further comprising:

a resistive structure operable to mimic resistance between said complementary bitlines and said sense amplifier's internal nodes, said resistive structure for generating an analog sense amplifier control (ASAE) signal based on said STOP signal after a predetermined delay;

a capacitor structure coupled to said resistive structure for mimicking said sense amplifier's capacitance; and means operating responsive to said ASAE signal to generate a sense amplifier enable control signal (SAEB) when said ASAE signal reaches a particular level.

11. The memory circuit as set forth in claim 10, wherein said particular memory cell comprises a static random access memory (SRAM) cell.

12. The memory circuit as set forth in claim 10, wherein said START signal and said STOP signal are combined into a single control signal such that said START signal comprises a first logic transition and said STOP signal comprises a second logic transition in said control signal.

13. The memory circuit as set forth in claim 10, wherein said particular memory cell comprises an electrically programmable read-only memory (EPROM) cell.

14. The memory circuit as set forth in claim 10, wherein said particular memory cell comprises a Flash memory cell.

15. The memory circuit as set forth in claim 10, wherein said STOP signal is generated when said voltage signal developed on said one of said pair of complementary reference bitlines reaches about half of $V_{DD}$ level.

16. The memory circuit as set forth in claim 10, wherein said SAEB signal is generated when said ASAE signal reaches about half of $V_{DD}$ level.

17. The memory circuit as set forth in claim 10, further including means to precharge said pair of bitlines.

18. The memory circuit as set forth in claim 10, wherein said means to generate said STOP signal comprises a comparator logic block coupled to one of said complementary reference bitlines.

19. The memory circuit as set forth in claim 10, wherein said means to generate said SAEB signal comprises a comparator logic block coupled to said resistive structure.

20. A low power read operation method for a memory circuit, comprising the steps:

commencing a memory read cycle with respect to a particular cell in said memory circuit based on a plurality of address signals, said plurality of address signals operating to drive a selected wordline associated with said particular cell high;

generating a control signal based on a reference cell read operation;

driving said selected wordline low responsive to said control signal; and activating a sense amplifier operably coupled to said particular memory cell via a pair of complementary bitlines, said sense amplifier operating to latch a data value stored in said particular cell based on a charge redistribution between said sense amplifier's internal nodes and said pair of complementary bitlines after said selected wordline is deactivated.

21. The low power read operation method for a memory circuit as set forth in claim 20, wherein said step of commencing a memory read cycle is based at least in part on a BANK SELECT signal operable to select a memory bank of said memory circuit.

22. The low power read operation method for a memory circuit as set forth in claim 20, wherein said control signal is generated when a voltage signal developed on a reference bitline associated with a reference cell reaches a predefined level.

23. The low power read operation method for a memory circuit as set forth in claim 22, wherein said predefined level comprises about half of $V_{DD}$ level.

24. The low power read operation method for a memory circuit as set forth in claim 20, wherein said sense amplifier is activated by a sense amplifier enable control signal (SAEB) generated in response to an analog sense amplifier control signal (ASAE), said ASAE signal being developed responsive to said STOP signal after a delay.

25. A memory instance, comprising:

means for commencing a memory read cycle with respect to a particular cell in said memory instance based on a plurality of address signals and a START signal, said plurality of address signals and said START signal operating to drive a selected wordline associated with said particular cell high;

means for generating a STOP signal based on a reference cell read operation;

means for driving said selected wordline low responsive to said STOP signal; and means for activating a sense amplifier operably coupled to said particular memory cell via a pair of complementary bitlines, said sense amplifier operating to latch a data value stored in said particular cell based on a charge redistribution between said sense amplifier's internal nodes and said pair of complementary bitlines after said selected wordline is deactivated.

26. The memory instance as set forth in claim 25, wherein said START signal and said STOP signal are combined into a single control signal such that said START signal comprises a first logic transition and said STOP signal comprises a second logic transition in said control signal.

27. The memory instance as set forth in claim 25, wherein said START signal is generated responsive at least in part to a BANK SELECT signal operable to select a particular memory bank in which said memory cell is disposed.

28. The memory instance as set forth in claim 25, wherein said STOP signal is generated when a voltage signal developed on a reference bitline associated with a reference cell reaches about half of $V_{DD}$ level.

29. The memory instance as set forth in claim 25, wherein said sense amplifier is activated by a sense amplifier enable control signal (SAEB) generated in response to an analog sense amplifier control signal (ASAE), said ASAE signal being developed responsive to said STOP signal after a delay.

30. The memory instance as set forth in claim 25, further including means to precharge said pair of bitlines.

* * * * *